United States Patent
Saeva

[11] 3,957,345
[45] May 18, 1976

[54] INFORMATION TRANSFER SYSTEM
[75] Inventor: Franklin D. Saeva, Webster, N.Y.
[73] Assignee: Xerox Corporation, Stamford, Conn.
[22] Filed: Mar. 26, 1975
[21] Appl. No.: 562,067

[52] U.S. Cl. .......................... 350/150; 350/160 LC
[51] Int. Cl.² ........................................ G02F 1/13
[58] Field of Search ............. 350/150, 154, 160 LC

[56] References Cited
UNITED STATES PATENTS
3,780,307 12/1973 Saeva.............................. 350/150 X Primary Examiner—Edward S. Bauer
Attorney, Agent, or Firm—James J. Ralabate; Michael H. Shanahan; George J. Cannon

[57] ABSTRACT

Circular dichroism within absorption bands of nematic liquid crystalline compositions of positive dielectric anisotropy in the twisted nematic structure is utilized for information transfer applications.

10 Claims, 4 Drawing Figures

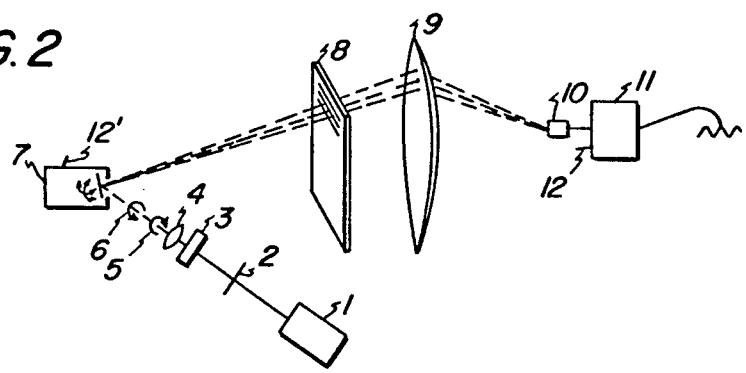
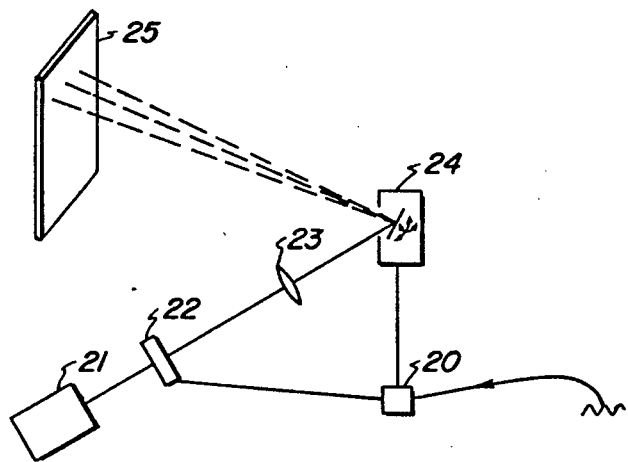
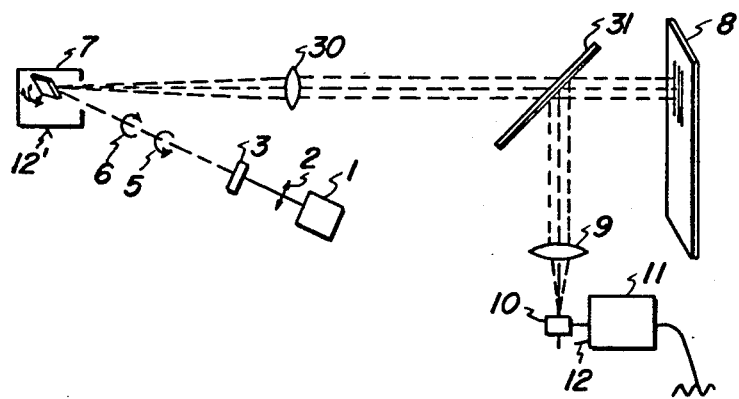

INFORMATION TRANSFER SYSTEM

BACKGROUND OF THE INVENTION

This invention relates to liquid crystalline compositions and, particularly, to uses of the twisted nematic structure in nematic liquid crystalline compositions. More particularly, this invention relates to the use of the discovery that the twisted nematic structure of nematic liquid crystalline compositions displays circular dichroism in absorption bands of the nematic.

Liquid crystalline substances exhibit physical characteristics, some of which are typically associated with liquids and others which are typically unique to solid crystals. The name "liquid crystals" has become generic to substances exhibiting these dual properties. Liquid crystals are known to appear in three different forms: the smectic, nematic, and cholesteric forms. These structural forms are sometimes referred to as mesophases thereby indicating that they are states of matter intermediate between the liquid and crystalline states. The three mesophase forms of liquid crystals mentioned above are characterized by different physical structures wherein the molecules of the compound are arranged in a manner which is unique to each of the three mesomorphic structures. Each of these three structures is well known in the liquid crystal art.

The twisted nematic structure is well known in the art. When a nematic liquid crystalline material is sandwiched between substrates treated for unidirectional homogeneous alignment, the nematic is externally perturbed into a helical structure when the rubbed surfaces are placed at some angle (other than 0°) with respect to one another. See, for example, M. Schadt and W. Helfrich, *Appl. Phys. Letts.*, 18, 127 (1971), "Voltage-Dependent Optical Activity of A Twisted Nematic Liquid Crystal."

Twisted nematic cells have been employed in display devices, particularly where electro-optic effects are modulated by the application of an electrical field across layers of nematic liquid crystalline material in the twisted nematic structure. See, for example, U.S. Pat. Nos. 3,731,986 to Fergason and 3,781,085 to Leibowitz.

The molecules of the nematic in the twisted structure of nematic liquid crystals can be thought of as arranged in very thin layers with the long axes of the molecules parallel to each other and to the local optic axes of the layers. The direction of the long axes of the molecules in each layer is displaced slightly from the corresponding direction in adjacent layers. This displacement is cumulative over successive layers so that overall displacement traces out a helical path. A comprehensive description of the optical properties of the twisted nematic structure of nematic liquid crystals is given in "Optics in Smoothly Varying Anisotropic Planar Structures: Application to Liquid Crystal Twist Cells", D. W. Berreman, 63, *J. Opt. Soc. Am.*, 1374 (1973).

Nematic liquid crystals in the twisted structure rotate the plane of polarization of light passing therethrough an amount between 0° and 90° equal to the angular difference between the alignment directions of the substrates. The intrinsic sense of the helical twist can be either right-handed or left-handed.

Extremely large extrinsic circular dichroism has been observed within the electronic transitions of achiral (optically inactive) solutes dissolved in cholesteric mesophases as reported in recently issued U.S. Pat. No. 3,780,304 to F. D. Saeva, et al and in the following articles by F. D. Saeva et al appearing in the *Journal of the American Chemical Society* (JACS): "Cholesteric Liquid-Crystal-Induced Circular Dichroism (LCICD) of Achiral Solutes. A Novel Spectroscopic Technique", Vol. 94, JACS, page 5135 (1972); "Cholesteric Liquid-Crystal-Induced Circular Dichroism (LCICD) V. Some Mechanistic Aspects", Vol. 95, JACS, page 7656 (1973); "Cholesteric Liquid-Crystal-Induced Circular Dichroism (LCICD). VI. LCICD Behavior of Benzene and Some of its Mono- and Disubstituted Derivatives", Vol. 95, JACS, page 7660 (1973); and "Cholesteric Liquid-Crystal-Induced Circular Dichroism (LCICD). VII. LCID of Achiral Solutes in Lyotropic Cholesteric Mesophases", Vol. 95, JACS, page 7882 (1973).

To our knowledge, circular dichroism has not been previously reported in absorption bands of the twisted structure of nematic liquid crystalline materials.

In rapidly growing areas of technology such as liquid crystals new methods, apparatus, compositions and articles of manufacture are often discovered for the application of the new technology in a new mode. The present invention relates to novel and advantageous uses of the twisted nematic structure of nematic liquid crystalline materials.

SUMMARY OF THE INVENTION

It is an object of the invention to provide an information transfer system utilizing circular dichroism within absorption bands of the twisted nematic structure of nematic liquid crystalline materials.

The above mentioned objects and advantages and others are realized in accordance with the invention by providing circular dichroism (the preferential absorption of one of right-handed or left handed circularly polarized light over the other) within the absorption bands of the twisted nematic structure of nematic liquid crystalline compositions in imagewise configuration in a nematic film; directing right hand circularly polarized light pulses and left hand circularly polarized light pulses through the same point in said film, the light pulses being in the absorption band of the nematic; and, converting the relative magnitude of the emergent right and left hand circularly polarized light pulses into a signal. Scanning the nematic film point by point provides signals which can be transferred to a receiver station where they are reconverted into an image corresponding to the imagewise pattern of circular dichroism in the nematic film.

The invention will be more fully understood from the following detailed description of various preferred embodiments thereof particularly when read in conjunction with the accompanying drawings wherein:

FIG. 2 is a schematic illustration of one embodiment of a scheme whereby information on circular dichroism is read from a liquid crystalline film by the transmission of light therethrough and the conversion of the information so read into synchronized signals.

FIG. 3 is a schematic illustration of a scheme whereby the synchronized signals produced by the schemes depicted in FIGS. 2 and 4 are converted to optical information which addresses optical information recording devices.

Figure 1:
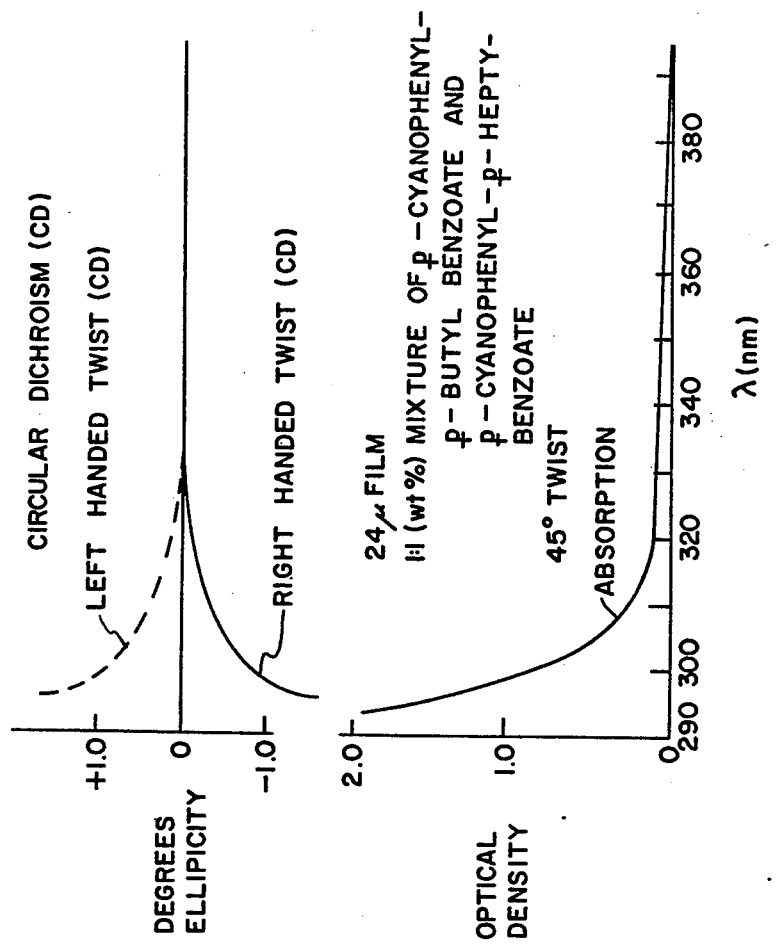
FIG. 1 shows the circular dichroism and absorption spectra of the twisted nematic structure of a 1:1 weight ratio of p-cyanophenyl-p-butyl benzoate and p-cyanophenyl-p-heptylbenzoate between about 290 nm and 390 nm.

FIG. 4 schematically illustrates a scheme whereby circular dichroism information is read from a liquid crystalline film by optical reflection therefrom and whereby such read information is converted into synchronized signals.

Referring now to FIG. 1, there is seen the circular dichroism and absorption spectrum of an about 24 micron thick film of a 1:1 weight ratio of p-cyanophenyl-p-butylbenzoate and p-cyanophenyl-p-heptylbenzoate when the nematic is provided with either a right handed 45° twist (solid line) or a left-handed 45° twist (dotted line) between the alignment directions of the top and bottom rubbed substrates. The circular dichroism in the absorption bands depicted is negative in sign with the right handed twisted nematic; that is, more right handed circularly polarized light is absorbed than left-handed circularly polarized light ($\epsilon_R > \epsilon_L$). Conversely, more left-handed circularly polarized light is transmitted than right-handed circularly polarized light.

In the left handed twisted nematic, the circular dichroism is of positive sign ($\epsilon_L > \epsilon_R$). It has been found that the sign of the circular dichroism in a twisted nematic structure depends upon the pitch and sense of twist of the nematic. The CD sign is negative in a right-handed twisted nematic and is positive in a left-handed twisted nematic.

The nematic liquid crystalline composition having positive dielectric anisotropy can comprise any suitable nematic liquid crystalline material having positive dielectric anisotropy, or a mixture of nematic liquid crystalline materials with materials having positive dielectric anisotropy, or a mixture of positive and negative dielectric anisotropy nematics which yield a net positive dielectric anisotropy nematic composition.

Typical suitable nematic liquid crystalline materials having positive dielectric anisotropy are well known in the liquid crystalline art and need not be listed in detail herein. These include cyanoaniline compounds such as p-hexyloxybenzylidene-p'-cyanoaniline and p-heptyloxybenzylidene-p'-cyanoaniline disclosed by M. Schardt and W. Helfrich in *Appl. Phys. Letts.*, 18, 127 (1971); nematic esters such as p-cyanophenyl-p-butylbenzoate and p-cyanophenyl-p-heptylbenzoate, both available from Aldrich Chemical Company; and butyl-p, p-ethoxyphenoxycarbonylphenyl carbonate, available from Eastman Chemical Products, Inc.

The positive dielectric anisotropic materials, including positive dielectric anisotropic smectics, to be added to nematic liquid crystalline materials can be added in any amount so long as the resulting composition retains the nematic mesomorphic state. Similarly, when mixtures of positive and negative dielectric anisotropic nematics are to be utilized, the amount of negative dielectric anisotropic nematic can be added in any amount so long as the resulting composition has a net positive dielectric anisotropy. Negative dielectric anisotropy nematic liquid crystalline materials are well known in the art and need not be listed in detail herein. Typical suitable negative dielectric anisotropy nematic liquid crystalline materials include N-(p-methoxybenzylidene)-p-butylaniline (MBBA); p-azoxyanisole (PAA); N-(p-ethoxybenzylidene)-p-butylaniline (EBBA); d$l$-4-(2-methylhexyl)-4'-ethoxy-$\alpha$-chlorotransstilbene; pp'-methoxypentyltolane, ethoxybenzylidene-p'-aminophenyl-3-methyl valerate, and trans-4-butyl-$\alpha$-chloro-4'-ethoxystilbene. Nematics of negative dielectric anisotropy having absorption bands in the visible include: p-(p-ethoxyphenylazo) phenyl heptanoate; p-(p-ethoxyphenylazo) phenyl undecylenate; 4,4'-bis(heptyloxy) azoxybenzene; p-(p-ethoxyphenylazo) phenyl hexanoate; 4,4'-bis(pentyloxy) azoxybenzene; p-(p-ethoxyphenylazo) phenyl valerate; 4,4'-bis(hexyloxy) azoxybenzene; 4,4'-dibutoxyazoxybenzene; p-(p-ethoxyphenylazo) phenyl crotonate; 4,4'-dibutoxyazoxybenzene; 4,4'-azoxydianisole; 4,4'-azoxydiphenetole N-p-methoxybenzylidene-p-phenylazoaniline; and 4,4'-azodiphenetole.

Typical suitable materials having positive dielectric anisotropy include smectic liquid crystalline materials having positive dielectric anisotropy such as p-methoxybenxylidene-p'-trifluoromethylaniline and p-heptyloxybenzylidene-p'-trifluoromethylaniline. These materials can be conveniently prepared by starting with about 0.10 mole of either p-methoxybenzylidene or p-heptyloxybenzaldehyde, depending upon the product desired. The starting compound is refluxed with p-trifluoromethylaniline for about four hours in about 100 cc of absolute ethanol to which a trace of p-toluenesulfonic acid has been added. The water produced in the reaction is removed by azeotroping over the 95% ethanol into a Dean-Stark trap. The reaction mixture is allowed to cool to room temperature and the crude product is crystallized from solution. The resulting product is recrystallized from hexane and yields about 0.06 moles of purified product. The purfied p-methoxybenzylidene-p'-trifluoromethylaniline is mesomorphic from about 50° to about 87°C, and the purified p-heptyloxybenzylidene-p'-trifluoromethylaniline is mesomorphic from about 38 to about 82°C.

Mixtures of liquid crystals can be prepared in organic solvents such as chloroform, petroleum ether and others which are typically evaporated from the mixture leaving the liquid crystal composition. Alternatively, the individual components of the liquid crystalline mixture can be combined directly by heating the mixed components above the isotropic transition temperature.

The above lists of typical suitable nematic liquid crystalline substances are intended to encompass mixtures of the above. These lists are intended to be representative only and are not to be construed as being exhaustive or limiting the invention to the specific materials mentioned. Although any nematic liquid crystalline material provided in the twisted nematic structure is suitable for use in the present invention, it should be recognized that various different nematic liquid crystal substances will only possess the necessary properties which make them suitable for use according to the invention at some specific temperature range which may be at room temperature or substantially below or above room temperature. However, all of the various substances, mixtures or combinations thereof will function according to the method at some temperature. Typically, the materials of the invention will be used at or near room temperature. Thus, it is preferred to employ liquid crystal substances which have a liquid crystal state at or near room temperature. Generally speaking, the liquid crystal substances will preferably be in the liquid crystal state at the desired operational temperature.

Typical suitable thicknesses of films or layers of nematic liquid crystalline materials are from about 0.5 to about 50 microns, although any thickness which will provide the desired effect can be used.

The twisted nematic structure is provided by sandwiching the nematic liquid crystalline material between two substrates or electrodes treated to impart unidirectional homogeneous alignment wherein the homogeneous alignment direction or one substrate makes an angle between 0° and 90° with the homogeneous alignment direction of the other substrate.

The substrates or electrodes may be treated by any technique suitable for providing homogeneous alignment of the nematic liquid crystalline material. Typical suitable techniques include the Chatelain technique of unidirectional rubbing as disclosed in P. Chatelain, *Bull. Soc. Franc. Min. Crist.*, 66, 105 (1943); providing a coating of aligning agent in contact with layer 4 of nematic liquid crystalline material such as, for example, one of the homogeneous aligning agents listed in Vol. 61, No. 7, *Proceedings of the IEEE*, p. 823, July, 1973 in the article "Surface-Produced Alignment of Liquid Crystals" by Kahn, Taylor, and Schonhorn; and the so-called Janning Technique described by J. L. Janning in *Appl. Phys. Letts.*, 21, 173 (1972).

The nematic liquid crystalline material is provided in the twisted nematic structure by about 0° to about 90° angular displacement between alignment directions of the treated substrates. The Chatelain and other surface treatments for homogeneous alignment can be employed. The substrates can be treated for the same direction alignment and one rotated or twisted from about 0° to about 90° with respect to the other to provide the angular displacement, or one substrate can be treated at an angle with respect to the treatment for the other substrate in order to provide the angular displacement. The direction of angular displacement determines the chirality or sense of twist of the twisted nematic structure. The standard used herein is the direction going from the bottom substrate to the top substrate, within about 0° to about 90°. If the direction from the bottom substrate alignment direction to the top substrate alignment direction within 0° to 90° is counterclockwise then the chirality of the helix is left handed. If the direction from the bottom substrate alignment direction to the top substrate alignment direction within about 0° to about 90° is clockwise then the chirality of the helix is right-handed. The substrates or electrodes may be of any shape and the homogeneous alignment treatment may employ aligning agents and angular film deposition (Janning Technique). Further, the substrates may both be treated to have the same alignment direction and the top substrate is then twisted or rotated to form an angle of from about 0° to about 90° with the other. A clockwise rotation of the top with respect to the bottom results in a right-handed sense of twist. A counterclockwise rotation of the top with respect to the bottom results in a left-handed sense of twist.

Once the chirality or sense of twist is established, it remains the same for when the cell is flipped over so that the former bottom substrate is now the top substrate. This can be easily visualized by crossing two pencils and viewing them from opposite sides.

At exactly 0° or no angular displacement there is homogeneous alignment of the nematic layer and at exactly 90° angular displacement the chirality of the twisted nematic structure generally includes a predominance of one handedness with the presence of the other handedness. Exactly 0° and 90° are therefore not preferred in utilizing the twisted nematic structure and at 90° there is non-uniformity of chirality.

EXAMPLE I

A nematic liquid crystalline composition is prepared by mixing one part by weight p-cyanophenyl-p-butyl benzoate (available from Aldrich Chemical Co., catalog number 18-032-7) and one part by weight p-cyanophenyl-p-heptyl benzoate (available from Aldrich Chemical Co., catalog number 18-031-9).

A sandwich member is formed by placing the nematic solution between two quartz substrates treated by the Chatelain rubbing technique. Both substrates are rubbed uniformly in the same direction and, after the nematic-additive solution is placed on the bottom substrate the top substrate is placed on the layer of solution and rotated clockwise about 45°. The nematic assumes the twisted nematic structure with a right-handed helix.

The about 290 nm to about 390 nm region of the absorption spectrum of the twisted nematic is analyzed with a Cary 15 Sectrophotometer. The analysis is shown in FIG. 1.

The sandwich member is placed in a Cary 61 Spectropolarimeter operating in the circularly dichroic mode and the same region of the absorption spectrum of the twisted nematic is analyzed for circular dichroism. Circular dichroism is exhibited within the investigated region of the twisted nematic. The observed circular dichroism is shown in FIG. 1 in solid line.

EXAMPLE II

Example I is repeated except that the top substrate residing on the nematic layer is rotated counterclockwise with respect to the bottom substrate. The sense of twist in the nematic is left-handed and the resulting positive circular dichroism is shown in FIG. 1 is dotted line.

EXAMPLE III

The sandwich member of Example I is heated above the isotropic temperature for the nematic liquid crystalline composition. While so heated, the same region of the absorption spectrum of the nematic composition is analyzed with a Carey 61 Spectropolarimeter operating in the circularly dichroic mode. Circular dichroism is not exhibited.

The sandwich member is allowed to cool below the isotropic temperature and transforms from the isotropic to the twisted nematic structure. The circular dichroism of FIG. 1 (solid line) is exhibited upon cooling. This demonstrated that circular dichroism is present in the twisted nematic structure of the nematic composition but not in the non-liquid crystalline isotropic composition.

EXAMPLE IV

The sandwich member of Example I is prepared except that no rotation of substrates occurs. The nematic liquid crystalline composition is in the homogeneous nematic texture and exhibits no circular dichroism. This demonstrates that it is the twisted nematic structure rather than liquid crystalline which exhibits circular dichroism.

EXAMPLE V

The sandwich member of Example I is prepared as in Example I and placed in the Carey 61 Spectropolarimeter operating in the circular dichroism mode. In the circularly dichroic mode, the spectropolarimeter emits alternately right hand circularly polarized light pulses and left hand circularly polarized light pulses of equal intensity. These pulses are of selectively variable wavelength and are produced by passing monochromatic light through a linear polarizer and a Pockell cell quarter waveplate (a single crystal of potassium dideuterium phosphate).

When the circular dichroism is measured between about 290 nm and about 390 nm within the absorption band of the twisted nematic, the intensity detector indicates more right hand circularly polarized light intensity than left hand circularly polarized light intensity, indicating (since the pulses were initially of equal intensity) that a larger percentage of the left hand circularly polarized light was absorbed by the anthracene than the percentage of right hand circularly polarized light so absorbed. By convention, the circular dichroism is of negative sign since $\epsilon_L < \epsilon_R$.

EXAMPLE VI

Example V is repeated except that, in preparing the sandwich member according to Example I, the top substrate is rotated counterclockwise about 45° and imparts a right handed sense of twist or chirality in the resulting twisted nematic structure. The intensity detector indicates more left hand circularly polarized light intensity than right hand circularly polarized light intensity emerging through the sandwich members. Since the pulses were of original equal intensity, this indicates that a larger percentage of right hand circularly polarized light was absorbed by the twisted nematic than the percentage of left hand circularly polarized light so absorbed. By convention, the circular dichroism is of positive sign since $\epsilon_R < \epsilon_L$.

EXAMPLE VII

The sandwich member of Example I is prepared as in Example I except that the glass substrates are coated with indium oxide and the indium oxide coatings are treated by the Chatelain rubbing technique. The twisted nematic structure of Example I is provided.

An A.C. voltage of about 50 volts at 10 KHz is applied to the indium oxide coatings, applying an electric field across the nematic while the member is being examined as in Example I for circular dichroism. Upon application of the field, the nematic becomes homeotropically aligned and circular dichroism is no longer observed in the investigated region of the twisted nematic absorption band.

Example VII demonstrates that the application of electric fields at or above the threshold for twisted nematic to homeotropic nematic transition extinguishes the circular dichroism.

EXAMPLE VIII

Example VII is continued by adjusting the A.C. voltage up to about 1.9 volts A.C. at 10 KHz. The induced circular dichroism reappears and is more intense (of greater magnitude) than in Example I.

EXAMPLES IX—X

Examples VII and VIII are repeated except that one of the indium oxide coatings is provided in image configuration. The Example VII extinction of circular dichroism and the Example VIII magnitude change in circular dichroism now occur in imagewise configuration.

The invention described herein may be practiced with conventional apparatus, the availability of which is well known to those people skilled in the art of information transfer. In accordance with the present invention circular dichroism in absorption bands of twisted nematic liquid crystalline compositions is utilized to generate the information which is transferred and subsequently converted into synchronized signals at the transmitting station and optionally subsequently reconverted into optical information at the receiving station utilized to address an optical information recording device at the receiving station.

Referring now to FIG. 2, there is seen a light source 1 which generates light of very narrow range of wavelengths, preferably of about a single wavelength, the optical output of which is linearly polarized by linear polarizer 2. The linearly polarized light passing through linear polarizer 2 then passes through an electro-optic modulator which produces alternately right-handed circularly polarized light and left-handed circularly polarized light, in sequence, to produce pulses of light which, in succession in the direction of propagation, comprises a repetitive sequence of alternating right-hand circularly polarized light pulse followed by a left-hand circularly polarized pulse and so forth. For convenience of description, the term circularly polarized pulses (hereafter denoted CPLP) is used herein to refer to the sequence of a right-handed circularly polarized light followed by a left-handed circularly polarized pulse of light followed by a right-handed circularly polarized pulse of light followed by a left-handed circularly polarized pulse of light and so on, in repetitive sequence. The CPLP then passes through a focusing lens 4 which focuses the CPLP onto scanner 7 which, by reflection, is adapted to direct the CPLP across the surface of liquid crystalline film 8 in the direction from left to right or right to left (as in a line of typing) and in the direction of from top to bottom or bottom to top (as in the spacing of typed lines). The CPLP passes through liquid crystal film 8, in optical transmission. Since, as previously stated above, circular dichroism is by definition the difference in absorption of left-hand circularly polarized light and right-hand circularly polarized light, or vice versa, depending upon the sign of the circular dichroism, it can be seen that the CPLP is affected in the relative amounts of magnitude or strength of the individual right-handed circularly polarized light pulses and left-handed circularly polarized light pulses passing through liquid crystal film 8. The CPLP is thus changed from CPLP comprising right-handed circularly polarized light pulses and left-handed circularly polarized light pulses of equal magnitude which exists prior to impingement of liquid crystal film 8 into a CPLP which is modulated in accordance to the presence or absence of circular dichroism at a particular point in liquid crystal film 8, in accordance with the sign of circular dichroism present at a particular point in film 8, in accordance with the magnitude of circular dichroism present at a particular point in film 8, and so forth, as previously described above. The modulated CPLP then passes through a collecting lens 9 which focuses the modulated CPLP from any point in liquid crystal film 8 into intensity detector 10. Intensity detector 10 detects alternate strengths or magnitudes of right-hand circularly polarized light and left-hand circularly polarized light and, in that sense, reads the modulated CPLP. A signal is generated by the intensity detector 10 which is modulated in real time in accordance with the intensity detected. The modulated signal from detector 10 enters signal transmitter and processor 11 which generates synchronized pulses or signals for transmission to the receiving station where it is responded to by the readout scheme depicted in FIG. 3.

The synchronized pulse or signal produced by signal transmitter and processor 11 in FIG. 2 is received at the receiving station by synchronizer 20, schematically illustrated in FIG. 3. Synchronizer 20 is operatively connected to modulator 22, which modulates the intensity of light from light source 21, and is also operatively connected to scanner 24 which, by reflection, directs intensity modulated light from light source 21 upon the surface of optical information receiving member 25. In real time, synchronizer 20 positions scanner 24 so that the point of receiving member 25 that is addressed by the reflected intensity modulated light corresponds in an information sense (for example, the same relative position in an image) to the point in liquid film 8 of FIG. 2 which produced the modulation in the CPLP detected by intensity detector 10 and transmitted by element 11 of FIG. 2 in the form of synchronized pulses or signals. In this manner, the loop is closed between a point in liquid crystal film 8 of FIG. 3 and a corresponding point in an information sense in receiving member 25 of FIG. 3. Thus, it can be seen that the image transfer system herein described is a system which reads information bit by bit. The information read, of course, is information concerning circular dichroism in the nematic liquid crystalline material of film 8 in FIG. 2.

In operation, the readout scheme illustratively depicted in FIG. 3 can be practiced with any conventional readout scheme and by using apparatus well known to those skilled in the art. Preferably, light source 21 in FIG. 3 is identical with light source 1 of FIG. 2 in order to minimize any distortions, difficulties, or inconveniences caused by the use of two different sources in a synchronized mode. Lasers are preferred as a light source for the reasons stated above. Modulator 22 can be selected from a broad range of modulators but is to be selected as to be compatible with receiving member 25. That is, if receiving member 25 is micro-film or a photo-conductive drum, modulator 22 is conveniently an intensity modulator which modulates the intensity of the output of light source 21 into pulses of varying intensities corresponding to the relative strengths of right-hand circularly polarized light and left-hand circularly polarized light transmitted through liquid crystal film 8 of FIG. 2. As clearly indicated, this is on a synchronized basis so that the modulated light striking any particular point on receiving member 25 of FIG. 3 presents information to that particular point on receiving member 25 which corresponds to the circular dichroism information on the corresponding particular point, in the informational sense, of liquid crystal film 8 of FIG. 2. In this connection, input element 12 of transmitter and processor 11 of FIG. 2 is operatively connected to output element 12' of scanner 7 of FIG. 2 so that the synchronized pulses or signals generated by transmitter 11 contains information on the position of scanner 7 as well as information on the relative strengths of right-handed circularly polarized light and left-handed circularly polarized light.

Referring now to FIG. 4, there is seen schematically illustrated an embodiment of a read in scheme which is the reflection equivalent of the transmission scheme depicted in FIG. 2. That is, like numerals refer to like elements. Read in by optical reflection is accomplished in FIG. 4 by the insertion of a beam splitter such as a half-silvered mirror 31 between scanners 7 and liquid crystal film 8. Beam splitter 31 acts essentially as a one-way mirror, allowing light reflected from scanner 7 through lens 30 to pass through beam splitter 31 and impinge upon liquid crystal film 8 but which prevents light reflected from liquid crystal film 8 from passing back through beam splitter 31, but rather, causes light reflected from film 8 to be directed into collecting lens 9.

Any suitable apparatus may be selected for the particular elements depicted in FIGS. 2, 3, and 4 so long as they are selected to be system compatible. Typical suitable apparatus for the various elements include, for example, a raster or digital scan scanner for scanner 7 and scanner 24; a laser or an incandescent light source used in conjunction with appropriate filters and modulators for light source 1 and light source 21; Polaroid Sheet for linear polarizer 2, available from the Polaroid Corporation; quarter waveplates available from the Polaroid Corporation oscillated between two positions approximately 90° apart, each position providing an orientation of the retardation axis of the quarter waveplate to the transmission direction of the linear polarizer 2 of about 45°, can conveniently constitute electro-optic modulator 3; liquid crystal film 8 can comprise any of the aforementioned nematic liquid crystalline compositions; a square law detector, such as, for example, the EG and G light mike available from the EG and G Company; signal transmitter and processor 11 can be selected from a host of electronic amplifiers currently commercially available; similarly, intensity modulator 22, synchronizer 20, optical information recording element 25, beam splitter 31 and the various lenses can be selected from any of the many commercially available respective elements.

As can be seen from the above description, the twisted nematic structure of nematic liquid crystalline compositions exhibits circular dichroism which can be selectively created, and can be selectively varied in intensity by the application of an electrical field. Thus, differences in circular dichroism can be selectively created at predetermined locations on liquid crystal film 8; such as, for example, an imagewise pattern of circular dichroism against a background of no circular dichroism, or, an imagewise configuration of circular dichroism which is of relatively great magnitude or strong intensity against a background of circular dichroism which is of relatively low intensity or small magnitude.

It will be appreciated, of course, that the light produced by light source 1 and light source 21 should at least contain light at a wavelength within the absorption band of interest of the twisted nematic liquid crystalline compositions.

While the invention has been described in detail with respect to certain embodiments thereof it is not intended to be limited thereto, but rather it will be appreciated by those skilled in the art the modifications and variations are possible which are within the spirit of the invention and the scope of the claims.

For example, scanners 7 and 24 may be selected such that they independently operate in timed sequence with respect to corresponding informational points of liquid crystal film 8 and receiver or recorder member 25. In that case, output 12' and input 12 in FIGS. 3 and 5 may be dispensed with, and synchronizer 20 may additionally be selected so that it need not be operatively connected to scanner 24 in the readout scheme.

Generally speaking, this invention involves a bit by bit read in sequence of liquid crystal induced circular dichroism such as, for example, an imagewise pattern of twisted nematic circular dichroism intensity. Any suitable apparatus may be used such as, for example, the use of a light source whose output is first linearly polarized and subsequently converted into alternating left and right hand circularly polarized light pulses by means of a properly oriented electro-optic modulator. Other suitable apparatus such as, a lens, scanner, and collecting lens can be employed to transfer the circular dichroism information bit by bit into an intensity detector-signal transmitter and processor component which detects the alternate strengths of left and right hand circularly polarized light. The apparatus is selected and operatively connected, typically, so that pulses of both right-hand circularly polarized light and left-hand circularly polarized light in the CPLP impinge upon the same information point of the liquid crystal film; so that a comparison can be made by the intensity detector as to the relative strengths of right and left-hand circularly polarized light either transmitted (as in FIG. 3) or reflected (as in FIG. 5) by the twisted nematic composition in which circular dichroism is displayed; so that if, for example, there is no difference in absorption of left and right-handed circularly polarized light, the synchronizer in the information transfer read in system and which controls the intensity modulator and scanner of the read in system, will not be activated; and, so that when circular dichroism is detected an electronic pulse is sent to the synchronizer so that the synchronizer activates the intensity modulator and the scanner allowing the output (readout) light source, such as a laser beam, to write onto microfilm or a photoconductive drum or other optical information recording device to thereby produce a permanent record of the circular dichroism image.

Finally, it will be appreciated that the inclusion of a photoconductor in contact with the nematic liquid crystalline material between two electrodes can be employed. This will permit imagewise configuration of either the existence or intensity of circular dichroism in film 8 with actinic radiation input. Either A.C. or D.C. voltages can be applied between the two electrodes to cause, upon exposure of the photoconductor with actinic radiation, a change in circular dichroism intensity by tilting of the nematic molecules or extinction of the circular dichroism by transition of the nematic to the uniaxial homeotropic texture.

What is claimed is:

1. A method for transferring information, comprising:
   a. providing in the twisted nematic structure a nematic liquid crystalline composition having positive dielectric anisotropy and an absorption band which exhibits circular dichroism when said nematic composition is in the twisted nematic structure;
   b. directing at least one right-handed circularly polarized light pulse and at least one left-handed circularly polarized light pulse through a point in said twisted nematic liquid crystalline composition, said light pulses prior to impingement being of equal intensity and within the absorption band of said twisted nematic liquid crystalline composition; and
   c. subsequently converting emerging relative intensities of said at least one right and left handed circularly polarized light pulses into a signal.

2. The method of claim 1 wherein said nematic liquid crystalline composition comprises a smectic liquid crystalline material having positive dielectric anisotropy.

3. The method of claim 1 wherein said nematic liquid crystalline composition comprises a mixture of nematic liquid crystalline materials of positive and negative dielectric anisotropy, said composition having a net positive dielectric anisotropy.

4. The method of claim 1 wherein said absorption band is in the visible region of the electromagnetic spectrum.

5. The method of claim 1 wherein said nematic liquid crystalline composition comprises a mixture of p-cyanophenyl-p-butyl benzoate and p-cyanophenyl-p-heptyl benzoate.

6. The method of claim 1 wherein in imagewise configuration circular dichroism is exhibited in image areas and not exhibited in background areas by said twisted nematic composition.

7. The method of claim 1 wherein in imagewise configuration said twisted nematic composition exhibits circular dichroism of one intensity in image areas and of another intensity in background areas.

8. The method of claim 1 wherein said twisted nematic composition exhibits circular dichroism of positive sign.

9. The method of claim 1 wherein said twisted nematic composition exhibits circular dichroism of negative sign.

10. The method of claim 1 wherein said twisted nematic composition is provided in layer configuration, said layer having a thickness of from about 0.5 to about 50 microns.

* * * * *